(12) United States Patent
Lin et al.

(10) Patent No.: US 7,816,695 B2
(45) Date of Patent: Oct. 19, 2010

(54) LIGHT EMITTING DEVICE AND METHOD OF FORMING THE SAME

(75) Inventors: Jin-Ywan Lin, Zhongli (TW); Chuan-Cheng Tu, Taipei (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 12/320,085

(22) Filed: Jan. 16, 2009

(65) Prior Publication Data

US 2009/0200560 A1 Aug. 13, 2009

Related U.S. Application Data

(63) Continuation of application No. 11/550,332, filed on Oct. 17, 2006, now Pat. No. 7,488,988.

(30) Foreign Application Priority Data

Oct. 20, 2005 (TW) .............................. 94136683 A (51) Int. Cl.
*H01L 33/00* (2010.01)

(52) U.S. Cl. ........................... 257/94; 257/99; 257/103; 438/22; 438/37

(58) Field of Classification Search .................... 257/79, 257/94, 99, 103; 438/22, 24, 37
See application file for complete search history.

(56) References Cited

U.S. PATENT DOCUMENTS

| 5,710,454 | A  | * | 1/1998 | Wu ............................. 257/413 |
| 6,838,704 | B2 | * | 1/2005 | Lin et al. ...................... 257/98 |

* cited by examiner

*Primary Examiner*—Phuc T Dang
(74) *Attorney, Agent, or Firm*—Bacon & Thomas, PLLC (57) ABSTRACT

An embodiment of present invention discloses a light-emitting device comprising a first multi-layer structure comprising a first lower layer; a first upper layer; and a first active layer able to emit light under a bias voltage and positioned between the first lower layer and the first upper layer; a second thick layer neighboring the first multi-layer structure; a second connection layer associated with the second thick layer; a connective line electrically connected to the second connection layer and the first multi-layer structure; a substrate; and two or more ohmic contact electrodes between the first multi-layer structure and the substrate.

20 Claims, 9 Drawing Sheets

LIGHT EMITTING DEVICE AND METHOD OF FORMING THE SAME

CROSS REFERENCE TO RELATED APPLICATIONS

This application is a continuation application of Ser. No. 11/550,332, filed Oct. 17, 2006, now U.S. Pat. No. 7,488,988 which claims priority to Taiwan application No. 094136683, filed Oct. 20, 2005, the disclosures of which are incorporated herein by reference in their entirety.

TECHNICAL FIELD

The present invention generally relates to a light emitting device, and more particularly to a wafer-level wired light emitting device and a method of forming the same.

BACKGROUND OF THE INVENTION

Light emitting diodes (LEDs), because of their unique structure and character of emitting lights, are different from those conventional light sources, and are more versatile for different applications. For example, LEDs are characterized in small size, high reliability, and high output, so they are suitable for many kinds of devices, such as indoor or outdoor large displays. Compared to conventional tungsten lamps, the LEDs are widely applied to communication devices or electronic devices because they work without a filament, consume less power, and respond more quickly. Furthermore, white LEDs have a better light-emitting efficiency, a longer lifetime, no harmful material like mercury, a smaller size, and lower power consumption, and therefore the LED devices are advancing in the lighting market.

Conventionally, after the fabrication of an LED wafer is completed, the wafer is cut into many LED chips. The LED chips are then arranged on a pre-designed circuit board to accomplish the manufacture of light emitting devices based on different needs. However, when the LED chips are individually wired by wire-bonding technique, the fabrication process is complicated and the conductive wire is susceptible to breakage. Consequently, the production yield is low and the cost is high.

Therefore, there is a need to provide a light emitting device and a method of forming the same so as to improve the bonding quality and to reduce the fabrication cost.

SUMMARY OF THE INVENTION

It is an object of this invention to provide a light emitting device, which includes a plurality of light emitting diode structures wired in wafer level to form the LEDs connected in series or in parallel so as to improve the yield and reduce the manufacture cost.

In one embodiment, the present invention provides a light emitting device which includes a substrate, an adhesive layer on the substrate, and a first multi-layer epitaxial structure and a second multi-layer epitaxial structure on the substrate. Each of the multi-layer epitaxial structures has a light emitting structure including an upper cladding layer, an active layer, a lower cladding layer, an ohmic contact epitaxial layer on the upper cladding layer, a first ohmic contact electrode on the ohmic contact epitaxial layer adhered to the substrate by the adhesive layer. A second ohmic contact electrode is on the lower cladding layer. A trench is formed within the light emitting structure to divide the active layer into a first portion and a second portion. A first electrode is on the lower cladding layer corresponding to the first portion of the active layer. A second electrode is on the second ohmic contact electrode corresponding to the second portion of the active layer. A connection layer formed in the light emitting structure and the first ohmic contact epitaxial layer couples the first electrode and the first ohmic contact electrode. A dielectric layer is between the first and the second multi-layer epitaxial structures. A conductive line couples the first electrode of one of the two multi-layer epitaxial structures to the first electrode or the second electrode of the other one of the first and the second multi-layer epitaxial structures.

It is a further object of this invention to provide a method for forming a light emitting deice, which integrates the wiring process of a plurality of light emitting diodes into the wafer fabrication to avoid the complicated processes of individual chip dicing, wire bonding, and connection.

In an alternative embodiment, the present invention provides a method for forming a light emitting device, which comprises providing a temporary substrate, forming a multi-layer epitaxial layer on the temporary substrate. The steps of forming the multi-layer epitaxial layer comprise forming a lower cladding layer on the temporary substrate, forming an active layer on a lower cladding layer, forming an upper cladding layer on the active layer, and forming an ohmic contact epitaxial layer on the upper cladding layer. The method further includes forming a plurality of first ohmic contact electrodes on the ohmic contact epitaxial layer, providing a substrate, forming an adhesive layer on the substrate, connecting the multi-layer epitaxial layer and the substrate by the adhesive layer so that the first ohmic contact electrode is between the ohmic contact epitaxial layer and the substrate, removing the temporary substrate to expose the lower cladding layer, forming a plurality of connection layers in the multi-layer epitaxial layer, forming a plurality of trenches in the multi-layer epitaxial layer to separate the active layer into a plurality of first portions and a plurality of second portions, forming a plurality of second ohmic contact electrodes on the lower cladding layer, forming a plurality of first electrodes on the lower cladding layer, the first electrode corresponding to the first portion of the active layer, and coupled to the first ohmic contact electrode by the connection layer, forming a plurality of second electrodes on the second ohmic contact electrode, the second electrode corresponding to the second portion of the active layer, removing a portion of the multi-layer epitaxial layer to form at least two independent multi-layer epitaxial structures, each of the multi-layer epitaxial structures having a first electrode and a second electrode, forming a dielectric layer between the two multi-layer epitaxial structures, and forming a conductive line coupling the first electrode of one of the two multi-layer epitaxial structures to the first electrode or the second electrode of the other one of the two multi-layer epitaxial structures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 5A-9A illustrate a process flow of forming a light emitting device in accordance with an embodiment of the present invention; and FIGS. 5B-9B illustrate a process flow of forming a light emitting device in accordance with another embodiment of the present invention.

DETAILED DESCRIPTION OF THE PREFERRED EMBODIMENTS

The present invention provides a light emitting device and a method thereof, wherein a plurality of light emitting diodes are wired in series or in parallel according to different design requirements during wafer fabrication. Therefore, a complicated fabrication process of individual chip dicing, wire bonding, and connection can be avoided to improve the yield and to decrease the manufacture cost. The present invention will now be described in detail with reference to FIGS. 1 to 9.

Figure 9A:
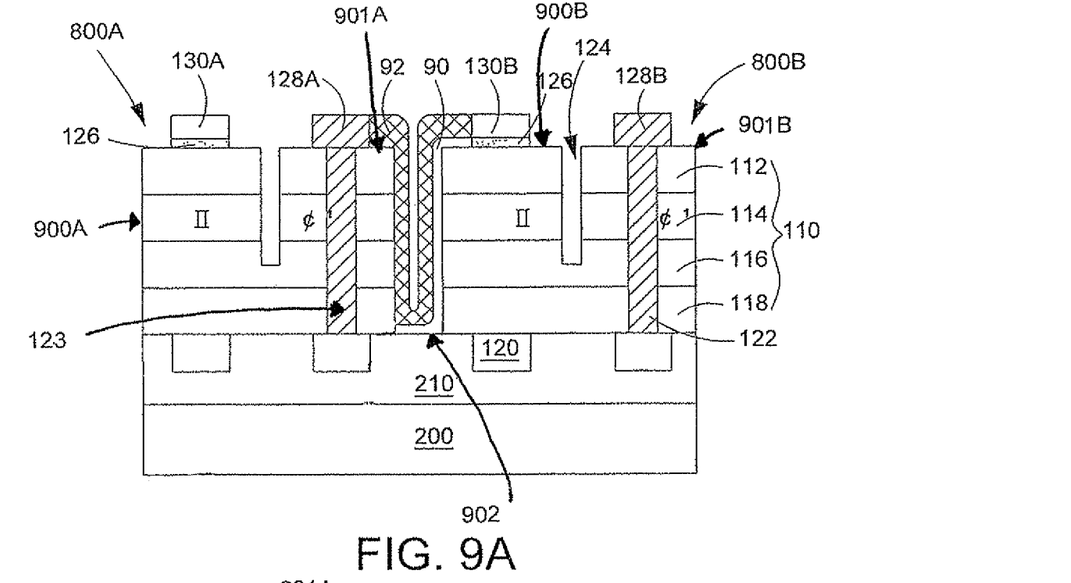
Figure 9B:
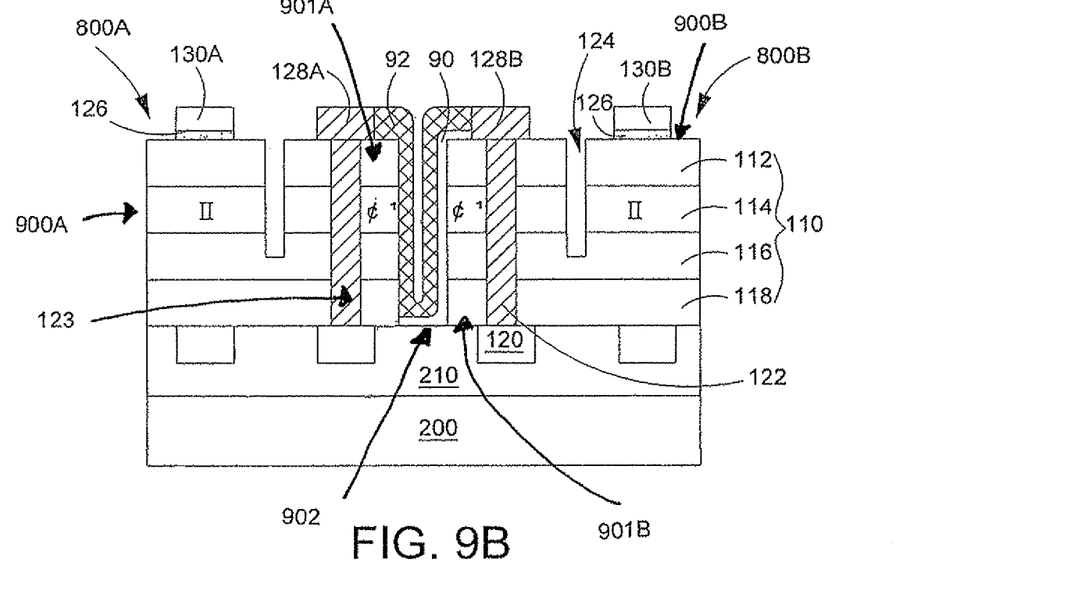

The preferred embodiments of the present invention are illustrated in FIG. 9A and FIG. 9B. Referring to FIG. 9A, the light emitting device includes a substrate 200, an adhesive layer 210 on the substrate 200, and multi-layer epitaxial structure 800A, 800B on the substrate 200. Both multi-layer epitaxial structures 800A and 800B include a light emitting structure, which includes an upper cladding layer 116, an active layer 114, and a lower cladding layer 112. An ohmic contact epitaxial layer 118 is on the upper cladding layer 116. A first ohmic contact electrode 120 is on the ohmic contact epitaxial layer 118. The first ohmic contact electrode 120 is adhered to the substrate 200 by the adhesive layer 210. A second ohmic contact electrode 126 is on the lower cladding layer 112. A trench 124 is formed within the light emitting structure to separate the active layer 114 into a first portion (I) and a second portion (II). A first electrode 128 is on the lower cladding layer 112 and corresponds to the first portion (I) of the active layer 114. A second electrode 130 is on the second ohmic contact electrode 126 and corresponds to the second portion (II) of the active layer 114. A connection layer 122 is formed in the light emitting structure and the first ohmic contact epitaxial layer 118 and to couple the first electrode 128B and the first ohmic contact electrode 120. A dielectric layer 90 separates the multi-layer epitaxial structure 800 into the first multi-layer epitaxial structure 800A and the second multi-layer epitaxial structure 800B. A connective line 92 couples the first electrode 128A of the first multi-layer epitaxial structure 800A to the second electrode 130B of the second multi-layer epitaxial structure 800B to form a series connection. In another embodiment, as shown in FIG. 9B, the connective line 92 couples the first electrode 128A of o the first multi-layer epitaxial structures 800A to the first electrode 128B of the second multi-layer epitaxial structures 800B to form a parallel connection. FIG. 9A and FIG. 9B also illustrate another embodiment of the present invention. The multi-layer epitaxial structure 800A includes a second multi-layer structure 900A, a second thick layer 901A and a second connection layer 123 associated with the second thick layer 901A. The multi-layer structure 800B includes a first multi-layer structure 900B, a first thick layer 901B, and a first connection layer 122 associated with the first thick layer 901 B. A lower portion 902 is formed between the multi-layer structure 800A and the multi-layer structure 800B such that the second thick layer 901A neighbors the first multi-layer structure 900B and/or the first thick layer 901B, and/or the first thick layer 901B neighbors the second multi-layer structure 900A and/or the second thick layer 901A. A connective line 92 bridges the lower portion 902 to electrically connect the two thick layers and/or the thick layer and the multi-layer structure. In addition, a dielectric layer 90 is formed nearby the connective line 92 to electrically disconnect the connective layer 92 from the thick layer and/or the multi-layer structure. Preferably, the dielectric layer 90 is formed on one side of the connective line 92, and more preferably, the greater portion of the dielectric layer 90 is formed on either the multi-layer structure 800A or the multi-layer structure 800B.

Figure 1A:
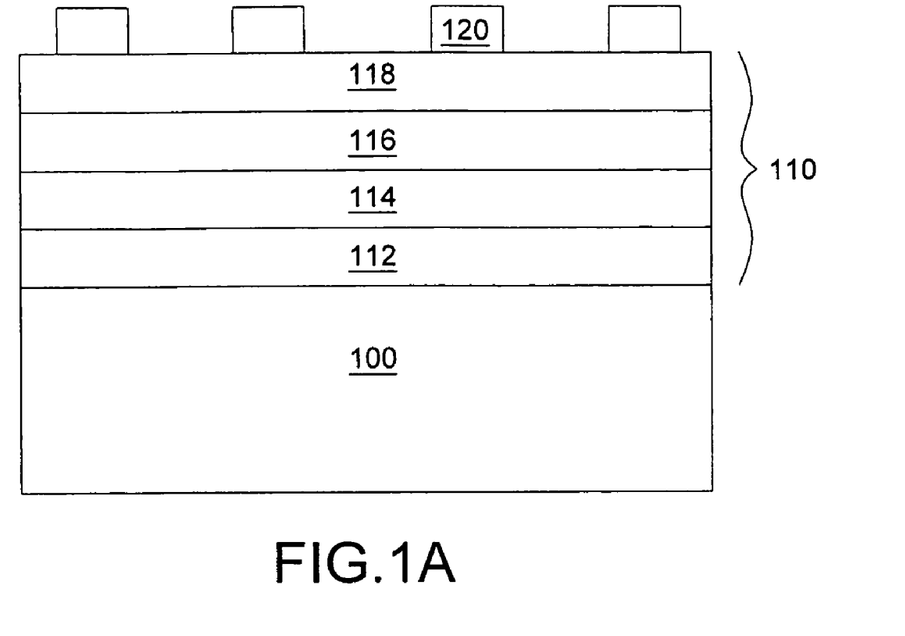
FIG. 1A and FIG. 1B are schematic views of a multi-layer epitaxial layer on a temporary substrate in accordance with different embodiments of the present invention.

Referring to FIG. 1A, a method for forming a light emitting device mentioned above is disclosed. The method includes a step of providing a temporary substrate 100, which includes an n-type GaAs substrate. Then, a multi-layer epitaxial layer 110 is formed on the temporary substrate 100. The steps of forming the multi-layer epitaxial layer 110 include steps of forming a lower cladding layer 112 on the temporary substrate 100, forming an active layer 114 on the lower cladding layer 112, forming an upper cladding layer 116 on the active layer 114, and forming an ohmic contact epitaxial layer 118 on the upper cladding layer 116. The lower cladding layer 112 includes an n-type $(Al_xGa_{1-x})_{0.5}In_{0.5}P$ epitaxial layer, wherein x is between 0.5 and 1 (x=0.5~1). The active layer 114 includes an undoped $(Al_xGa_{1-x})_{0.5}In_{0.5}P$ epitaxial layer, wherein x is between 0 and 0.45 (x=0~0.45). The upper cladding layer 116 includes a p-type $(Al_xGa_{1-x})_{0.5}In_{0.5}P$ epitaxial layer, wherein x is between 0.5 and 1 (x=0.5~1). When the active layer 114 contains no Al (x=0), the composition of the active layer 114 is $Ga_{0.5}In_{0.5}P$, which can emit lights with wavelength of about 635 nm (within the range of visible red light). Furthermore, the active layer 114 includes the homo-structure, single hetero-structure (SH), double hetero-structure (DH) or multiple quantum well (MQW) structure.

The steps of forming the ohmic contact epitaxial layer 118 include a step of forming a p-type ohmic contact epitaxial layer, which can be a GaP, GaAsP, AlGaAs or InGaP epitaxial layer. The band gap of the ohmic contact epitaxial layer 118 is higher than that of the active layer 114, so as to reduce the absorption of lights of the active layer 114. Preferably, the ohmic contact epitaxial layer 118 is doped with a higher carrier concentration to form a good ohmic contact.

Figure 1B:
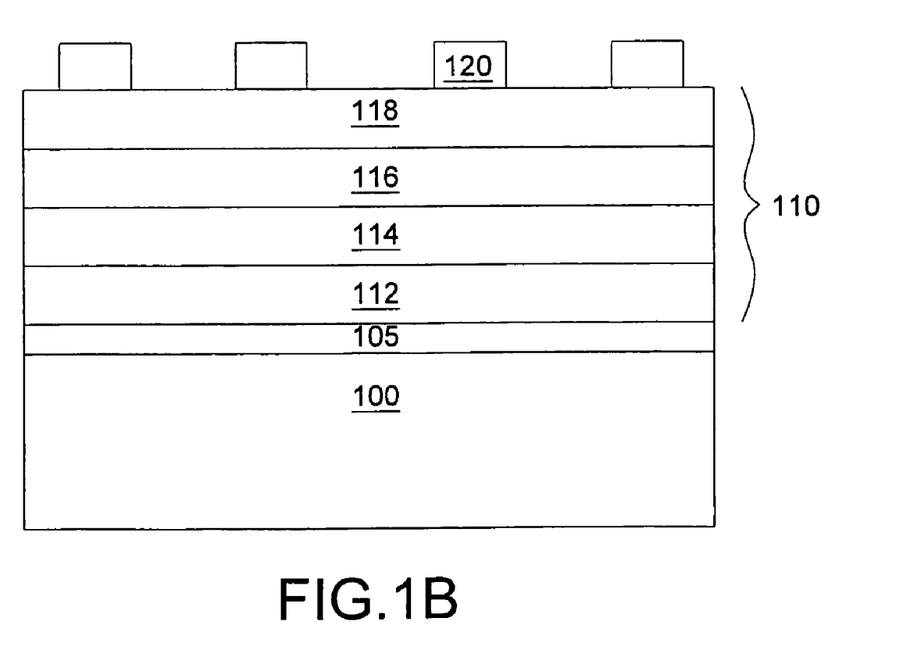

In another embodiment, as shown in FIG. 1B, it is noted that prior to the step of forming the multi-layer epitaxial layer 118, an etching stop layer 105 is selectively formed on the temporary substrate 100 as an over etch protection layer during the removal of the temporary substrate 100. The etching stop layer 105 can be a III-V compound semiconductor layer having a lattice matching with the temporary substrate 100 (such as GaAs temporary substrate) to reduce the dislocation density, such as InGaP layer or AlGaAs layer. Preferably, the etching stop layer 105 has an etching rate lower than that of the temporary substrate 100. Alternatively, when the lower cladding layer 112 is thick enough to serve the purpose of an etching stop layer, it is not necessary to additionally form the etching stop layer 105.

A plurality of first ohmic contact electrodes 120 is then formed on the ohmic contact epitaxial layer 118, as shown in FIG. 1A and FIG. 1B. In this embodiment, the steps of forming the first ohmic contact electrode include forming a p-type ohmic contact electrode by implementing the deposition, lithography, and etch processes.

Figure 2:
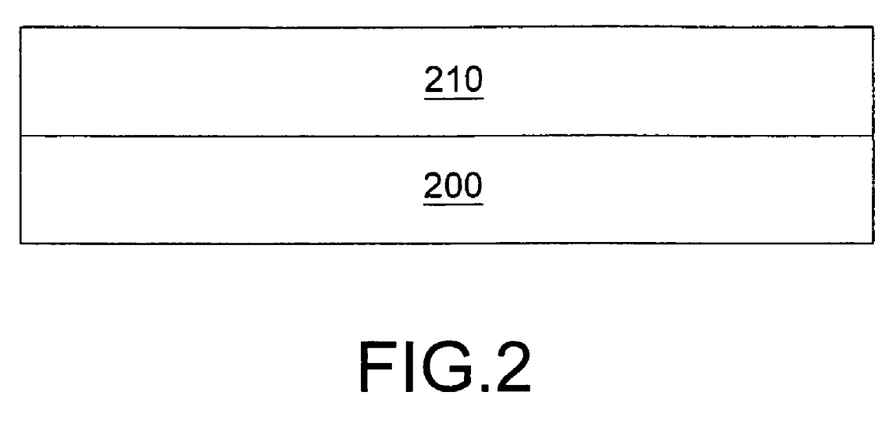
FIG. 2 is schematic view of an exemplary substrate of the present invention.

Referring to FIG. 2, a substrate 200 is provided. The substrate 200 can be a glass substrate, a sapphire substrate, a SiC substrate, a GaP substrate, a GaAsP substrate, a ZnSe substrate, a ZnS substrate, and a ZnSSe substrate. Then, an adhesive layer 210 is formed on the substrate 200. The adhesive layer 210 is selected from a group consisting of the spin-on glass, silicone, BCB (Benzocyclobutene) resin, epoxy, or polyimide.

Figure 3A:
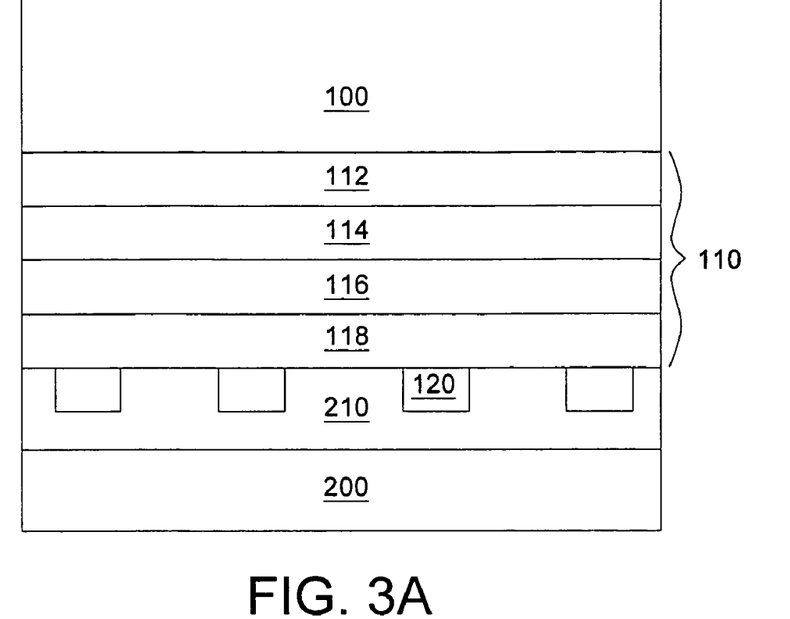
FIG. 3A and FIG. 3B are schematic views of bonding the structures of FIG. 1A and FIG. 1B to an exemplary substrate in accordance with the present invention.
Figure 3B:
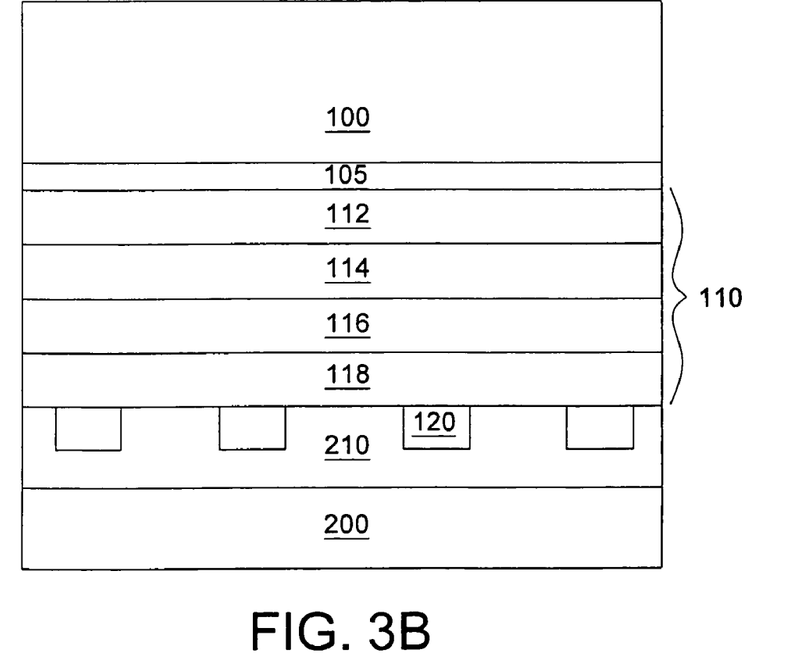

Referring to FIG. 3A and FIG. 3B, the multi-layer epitaxial layer 110 is attached to the substrate 200 by using the adhesive layer 210 so that the first ohmic contact electrode 120 is between the ohmic contact epitaxial layer 118 and the substrate 200. The attaching step is performed at an elevated temperature in the range of about 200° C. to about 600° C. with pressure to tightly attach the multi-layer epitaxial layer 110 and the substrate 100 together.

Figure 4:
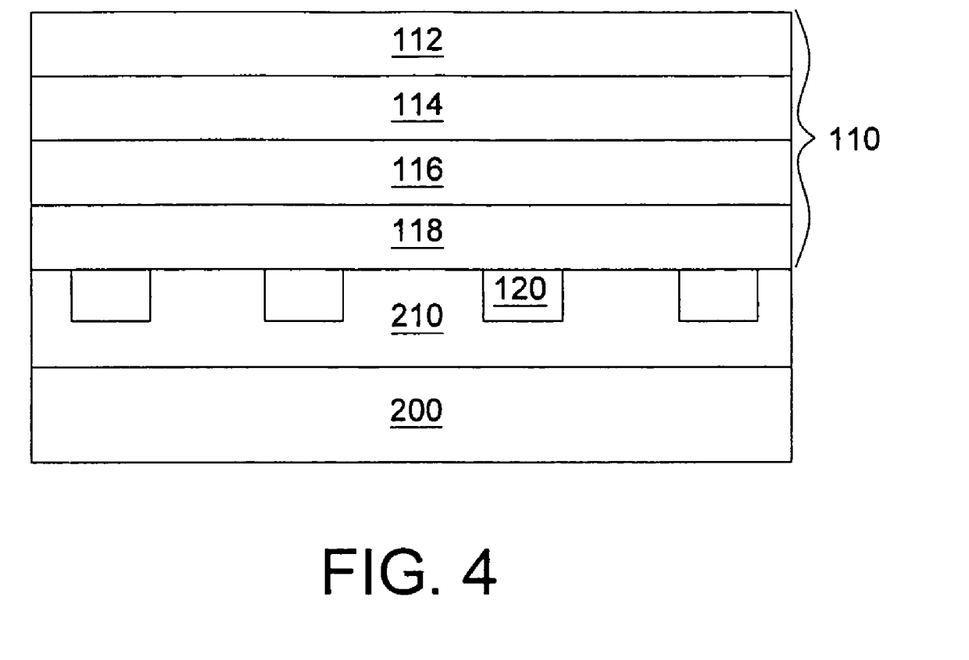
FIG. 4 is schematic view of the multi-layer epitaxial layer bonded to the substrate in accordance with the present invention.

Next, the temporary substrate 100 is removed to expose the lower cladding layer 112, as shown in FIG. 4. In this embodiment, the step of removing the GaAs temporary substrate 100 includes removing the GaAs temporary substrate 100 by using an etchant, such as the $5H_3PO_4:3H_2O_2:3H_2O$ solution or $NH_4OH:35H_2O_2$ solution. If the etching stop layer 105 is optionally implemented (FIG. 3B), the etching stop layer 105 is removed to expose the lower cladding layer 112 after the removal of the temporary substrate 100.

Figure 5A:
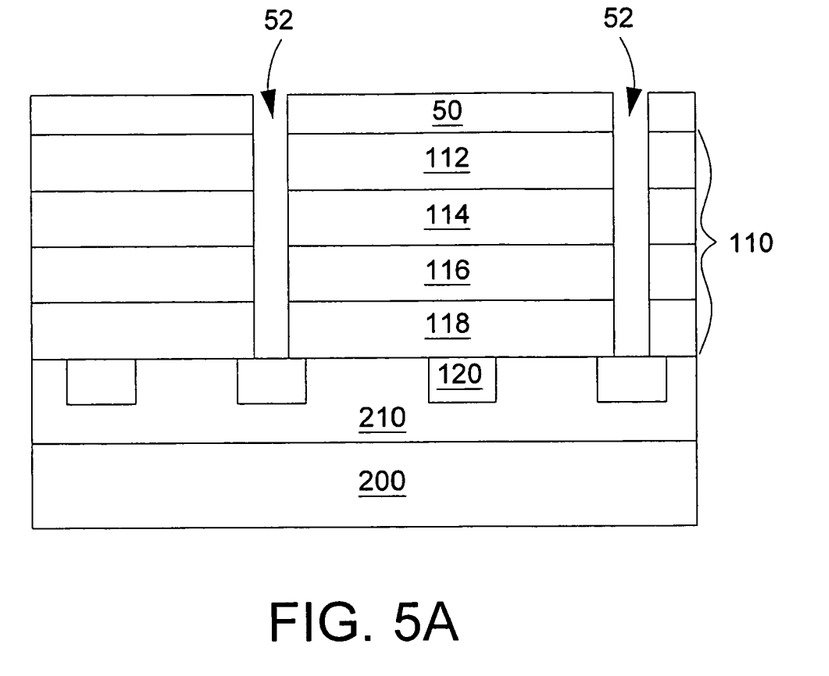
Figure 5B:
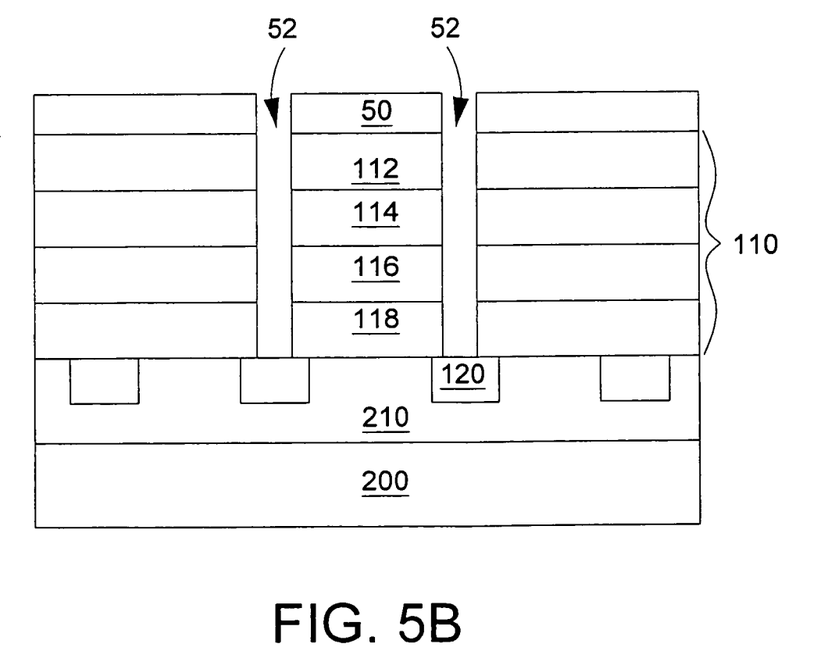
Figure 6A:
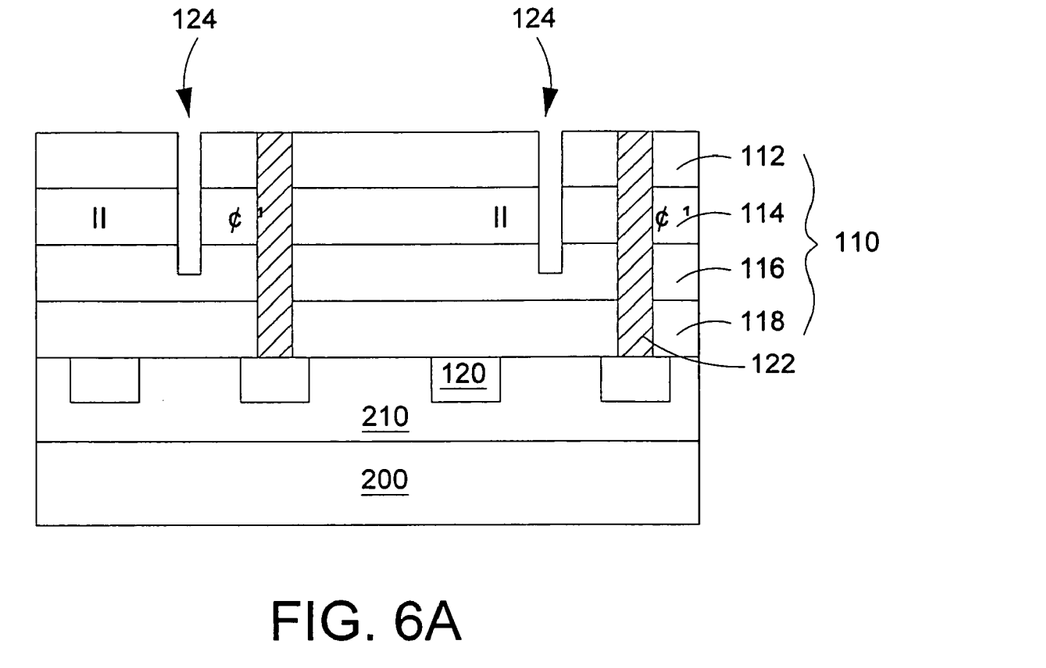
Figure 6B:
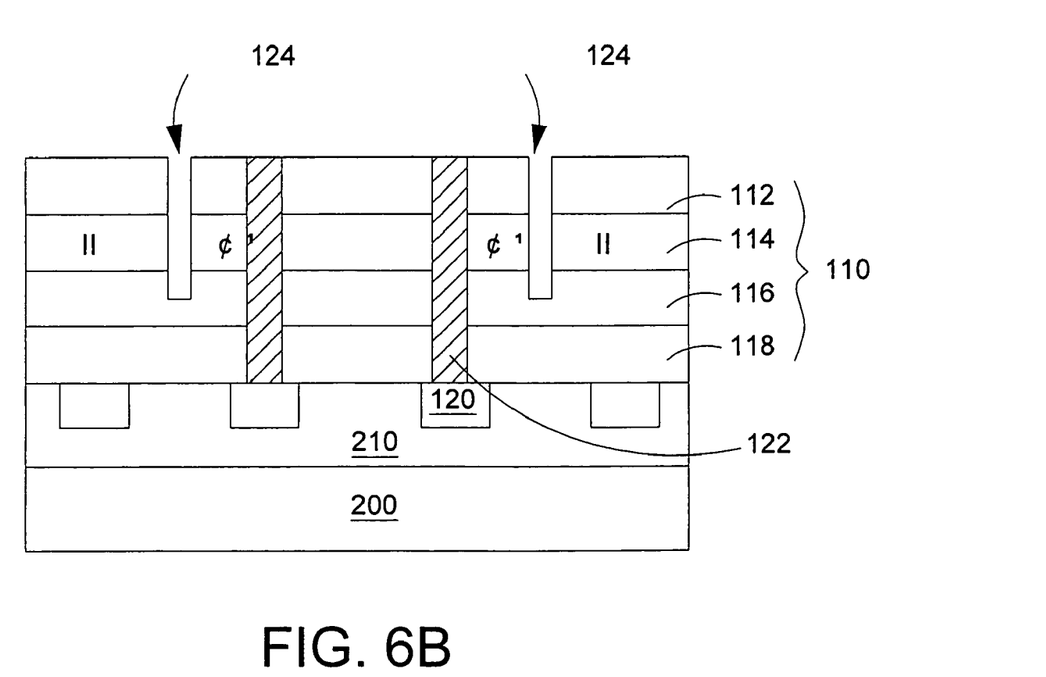

A plurality of connection layers 122 is formed in the multi-epitaxial layer 110. As shown in FIG. 5A and FIG. 5B, the steps of forming the connection layer 122 include forming a patterned photoresist layer 50 on the lower cladding layer 112. The patterned photoresist layer 50 defines a plurality of openings 52. The multi-layer epitaxial layer 110 is then etched to expose the first ohmic contact electrode 120 by using the patterned photoresist layer 50 as a mask. Then, the patterned photoresist layer 50 is removed. The openings are filled with a conductive material to form the connection layer 122, as shown in FIG. 6A and FIG. 6B. A plurality of trenches is formed in the multi-layer epitaxial layer to divide the active layer 114 into a plurality of first portions (I) and a plurality of second portions (II). The steps of forming trenches 124 include lithography and etching processes. It is noted that that the trench 124 is implemented to separate the active layer 114, and therefore, the etching is down through the lower cladding layer 112, the active layer 114 and a portion of the upper cladding layer 116. Alternatively, the etching can proceed further down to a interface between the upper cladding layer 116 and the first ohmic contact layer 118 or extend to a portion of the first ohmic contact layer 118 so as to ensure that the active layer 114 is separated.

Figure 7A:
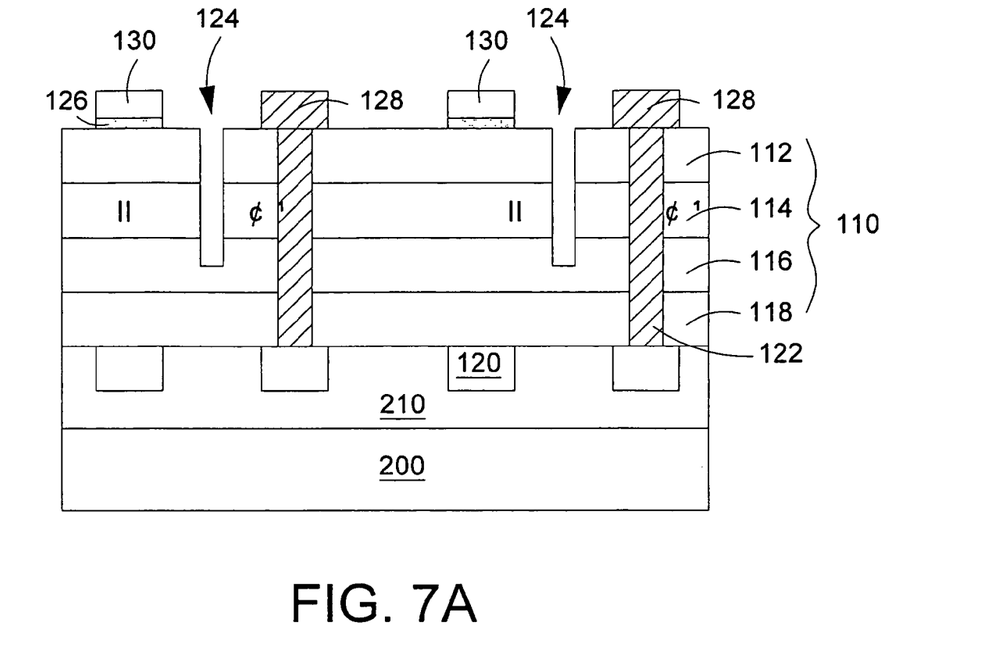
Figure 7B:
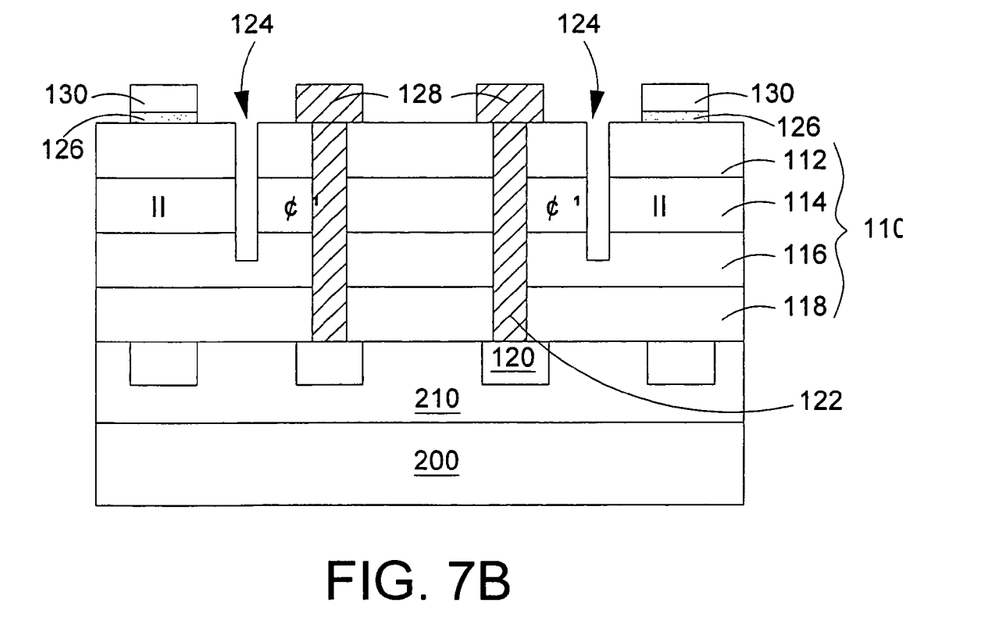

As shown in FIG. 7A and FIG. 7B, a plurality of second ohmic contact electrodes 126 (such as an n-type ohmic contact electrodes) is formed on the lower cladding layer 112. The steps of forming the second ohmic contact electrodes 126 include spinning a photoresist layer on the entire structure to fill in the trenches 124. The photoresist layer is exposed and developed to form a patterned photoresist layer, which defines the second ohmic contact electrodes 126. A plurality of first electrodes 128 is formed on the lower cladding layer 112. The first electrode 128 corresponds to the first portion (I) of the active layer 114 and couples with the first ohmic contact electrode 120 through the connection layer 122. Furthermore, a plurality of second electrodes 130 is formed on the second ohmic contact electrode 126. The second electrode 130 corresponds to the second portion (II) of the active layer 114. It is noted that the first electrode 128 and the second electrode 130 can be formed individually or simultaneously. For example, a single lithography process can define a pattern including the first electrode and the second electrode so as to form the first electrode 128 and the second electrode 130 simultaneously.

Figure 8A:
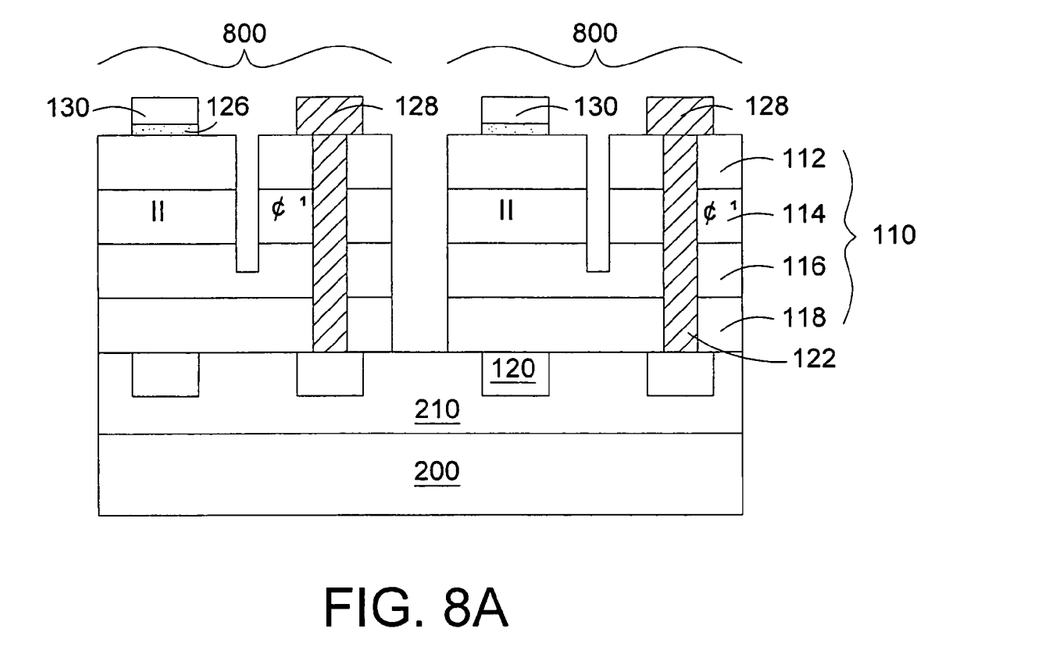
Figure 8B:
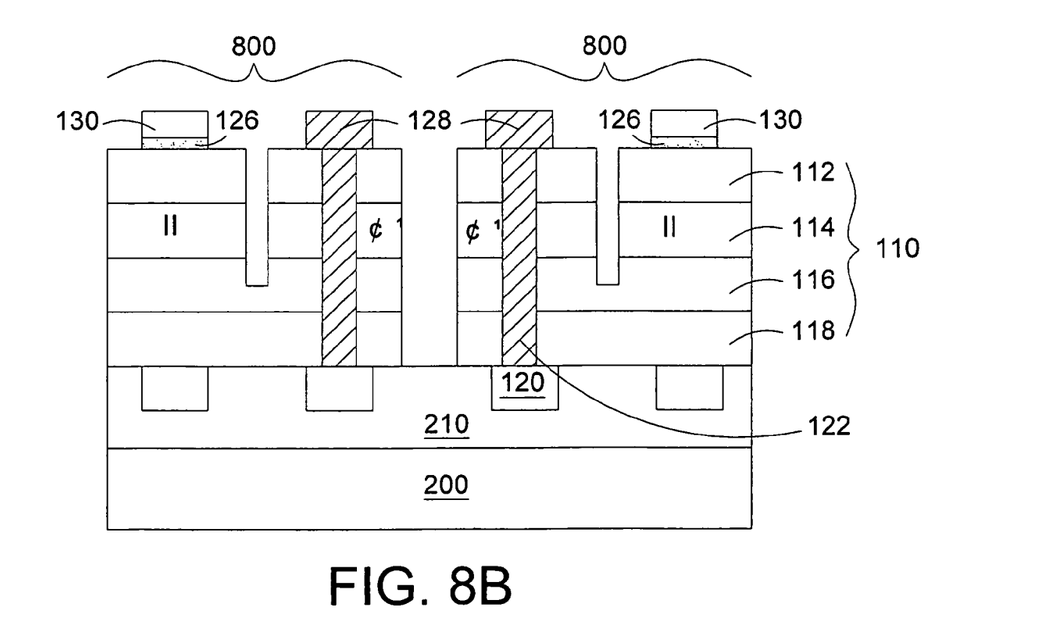

Referring to FIG. 8A and FIG. 8B, a portion of the multi-layer epitaxial layer 110 is removed to form at least two independent multi-layer epitaxial structures 800. Each multi-layer epitaxial structure 800 includes a first electrode 128 and a second electrode 130. The steps of forming the independent multi-layer epitaxial structure 800 include forming at least two independent multi-layer epitaxial structures 800 by an etching process or cutting process. The etching depth could be any depth sufficient to isolate the multi-layer epitaxial structures 800. For example, in this embodiment, the multi-layer epitaxial layer 110 is etched down to expose the adhesive layer 210 since the adhesive layer 210 is a non-conductive adhesive layer.

Referring FIG. 9A and FIG. 9B, a dielectric layer 90 is formed between the two multi-layer epitaxial structures 800 to form a first multi-layer epitaxial structure 800A and a second multi-layer epitaxial structure 800B. The dielectric layer 90 includes $Al_2O_3$, $SiO_2$, SiNx, spin-on glass, silicone, BCB resin, epoxy, or polyimide. Then, a conductive line 92 (for example, a metal line) is formed to connect the first electrode 128A of the second multi-layer epitaxial structure 800A and the first electrode 128B or the second electrode 130B of the second multi-layer epitaxial structure 800B. In other words, the plurality of multi-layer epitaxial structures 800 can be connected in parallel or in series, or both parallel and series according to different design requirement during a single connection process. Furthermore, the preset invention eliminates the need of designing an extra printed circuit board for connecting individual light emitting chips thereon, and accordingly, the fabrication process is simplified and the manufacture cost is reduced. In additional, the present invention utilizes the wafer level connection to connect the plurality of multi-layer epitaxial structures, and accordingly, the device size of the light emitting device is smaller than that of a conventional light emitting device which is fabricated by wire bonding.

Though only two multi-layer epitaxial structures in series or in parallel are illustrated in drawings, it is noted that the number and configuration of the multi-layer epitaxial structures are not limited to those illustrated in the embodiments. Nevertheless, the skilled in the art can recognize that various modifications may be made. The plurality of multi-layer epitaxial structures of the light emitting device can be connected in series connection, parallel connection, or parallel-series connection.

Although specific embodiments have been illustrated and described, it will be apparent that various modifications may fall within the scope of the appended claims.

We claim:

1. A light-emitting device, comprising:
  a first multi-layer structure comprising:
    a first lower layer;
    a first upper layer; and
    a first active layer able to emit light under a bias voltage and positioned between the first lower layer and the first upper layer;
  a second thick layer neighboring the first multi-layer structure;
  a second connection layer associated with the second thick layer;
  a connective line electrically connected to the second connection layer and the first multi-layer structure;
  a dielectric layer between the first multi-layer structure and the second connection layer;
  a substrate; and
  an ohmic contact electrode between the first multi-layer structure and the substrate.

2. The light-emitting device of claim 1, wherein the second thick layer has an opening associated with the second connection layer.

3. The light-emitting device of claim 1, wherein the second thick layer has an elevation substantially equal to that of the first multi-layer structure.

4. The light-emitting device of claim 1, wherein the second thick layer is electrically isolated from the first multi-layer structure.

5. The light-emitting device of claim 1, wherein the second connection layer is substantially through the second thick layer.

6. The light-emitting device of claim 1, further comprising an adhesive layer between the first multi-layer structure and the substrate.

7. The light-emitting device of claim 1, further comprising:
a second multi-layer structure electrically connected to the second connection layer and comprising:
a second lower layer;
a second upper layer; and
a second active layer able to emit light under a bias voltage and between the second lower layer and the second upper layer.

8. The light-emitting device of claim 1, further comprising:
a first thick layer associated with the first multi-layer structure; and
a first connection layer associated with the first thick layer.

9. The light-emitting device of claim 1, wherein the second thick layer is between the second connection layer and the first multi-layer structure.

10. A light-emitting device, comprising:
a first multi-layer structure comprising:
a first lower layer;
a first upper layer; and
a first active layer able to emit light under a bias voltage and positioned between the first lower layer and the first upper layer;
a second thick layer neighboring the first multi-layer structure and having an elevation substantially equal to that of the first multi-layer structure;
a second connection layer associated with the second thick layer;
a connective line electrically bridging the first multi-layer structure and the second connection layer;
a substrate; and
an ohmic contact electrode between the first multi-layer structure and the substrate.

11. The light-emitting device of claim 10, wherein the second thick layer has an opening associated with the second connection layer.

12. The light-emitting device of claim 1, wherein the second thick layer is electrically isolated from the first multi-layer structure.

13. The light-emitting device of claim 10, further comprising a second electrode above the second connection layer and being associated with the connective line.

14. The light-emitting device of claim 10, further comprising an adhesive layer between the first multi-layer structure and the substrate.

15. The light-emitting device of claim 10, further comprising:
a second multi-layer structure electrically connected to the second connection layer and comprising:
a second lower layer;
a second upper layer; and
a second active layer able to emit light under a bias voltage and between the second lower layer and the second upper layer.

16. The light-emitting device of claim 15, further comprising a trench between the second thick layer and the second multi-layer structure.

17. The light-emitting device of claim 10, further comprising:
a first thick layer associated with the first multi-layer structure; and
a first connection layer associated with the first thick layer.

18. The light-emitting device of claim 17, further comprising a trench between the first thick layer and the first multi-layer structure.

19. A light-emitting device, comprising:
a first multi-layer structure comprising:
a first lower layer;
a first upper layer; and
a first active layer able to emit light under a bias voltage and positioned between the first lower layer and the first upper layer;
a second thick layer neighboring the first multi-layer structure;
a second connection layer associated with the second thick layer;
a connective line electrically connected to the second connection layer and the first multi-layer structure;
a dielectric layer between the first multi-layer structure and the second connection layer; and
a substrate under the dielectric layer.

20. A light-emitting device, comprising:
a first multi-layer structure comprising:
a first lower layer;
a first upper layer; and
a first active layer able to emit light under a bias voltage and positioned between the first lower layer and the first upper layer;
a second thick layer neighboring the first multi-layer structure and having an elevation substantially equal to that of the first multi-layer structure;
a second connection layer associated with the second thick layer;
a connective line bridging a lower portion between the first multi-layer structure and the thick layer; and
a substrate under the lower portion.

* * * * *